(12) United States Patent
Haratsch et al.

(10) Patent No.: US 9,064,594 B2
(45) Date of Patent: *Jun. 23, 2015

(54) METHODS AND APPARATUS FOR SOFT DATA GENERATION FOR MEMORY DEVICES BASED ON PERFORMANCE FACTOR ADJUSTMENT

(75) Inventors: Erich F. Haratsch, Bethlehem, PA (US); Johnson Yen, Fremont, CA (US)

(73) Assignee: Seagate Technology LLC, Longmont, CO (US)

(*) Notice: Subject to any disclaimer, the term of this patent is extended or adjusted under 35 U.S.C. 154(b) by 561 days.

This patent is subject to a terminal disclaimer.

(21) Appl. No.: 13/063,874

(22) PCT Filed: Sep. 30, 2009

(86) PCT No.: PCT/US2009/059069
§ 371 (c)(1),
(2), (4) Date: Mar. 14, 2011

(87) PCT Pub. No.: WO2010/039859
PCT Pub. Date: Apr. 8, 2010

(65) Prior Publication Data
US 2011/0167305 A1    Jul. 7, 2011

Related U.S. Application Data

(60) Provisional application No. 61/194,751, filed on Sep. 30, 2008.

(30) Foreign Application Priority Data

Jun. 30, 2009  (WO) ................ PCT/US2009/049333

(51) Int. Cl.
*G11C 16/26* (2006.01)
*G11C 7/02* (2006.01)
(Continued)

(52) U.S. Cl.
CPC ........ *G11C 16/26* (2013.01); *G06F 2212/2022* (2013.01); *G06F 2212/1032* (2013.01);
(Continued)

(58) Field of Classification Search
None
See application file for complete search history.

(56) References Cited

U.S. PATENT DOCUMENTS 6,980,140 B1    12/2005  Rowland et al.
7,656,707 B2 *   2/2010  Kozlov ................... 365/185.05
(Continued)

FOREIGN PATENT DOCUMENTS

WO    WO 2007/132457    11/2007
WO    WO 2008/019347     2/2008
(Continued)

*Primary Examiner* — Yong Choe
*Assistant Examiner* — Glenn Gossage
(74) *Attorney, Agent, or Firm* — Duft Bornsen & Fettig LLP

(57) ABSTRACT

Methods and apparatus are provided for soft data generation for memory devices based on a performance factor adjustment. At least one soft data value is generated for a memory device, such as a flash memory device, by obtaining at least one read value; and generating the soft data value based on the obtained at least one read value and an adjustment based on one or more performance factors of the memory device. The read values may be soft data or hard data. Possible performance factors include endurance, number of read cycles, retention time, temperature, process corner, inter-cell interference impact, location and a pattern of aggressor cells. One or more pattern-dependent and/or location-specific performance factors may also be considered. The generated soft data value may be a soft read value used to generate one or more log likelihood ratios or may be the log likelihood ratios themselves.

20 Claims, 11 Drawing Sheets

(51) Int. Cl.

| | | |
|---|---|---|
| *G11C 7/04* | (2006.01) | |
| *G11C 16/34* | (2006.01) | |
| *G11C 11/56* | (2006.01) | |
| *G06F 12/00* | (2006.01) | |
| *G06F 11/10* | (2006.01) | |
| *G06F 12/02* | (2006.01) | |
| *G11C 16/04* | (2006.01) | |

(52) U.S. Cl.
CPC ........ *G06F12/0246* (2013.01); *G06F 11/1068* (2013.01); *G11C 7/02* (2013.01); *G11C 7/04* (2013.01); *G11C 11/5642* (2013.01); *G11C 16/0483* (2013.01); *G11C 16/3418* (2013.01); *G11C 2211/5634* (2013.01)

(56) References Cited

U.S. PATENT DOCUMENTS

| | | |
|---|---|---|
| 7,730,384 B2 | 6/2010 | Graef et al. |
| 7,975,192 B2 * | 7/2011 | Sommer et al. ............... 714/719 |
| 8,032,810 B2 | 10/2011 | Ishikawa et al. |
| 2006/0015802 A1 | 1/2006 | Hocevar |
| 2006/0195772 A1 | 8/2006 | Graef et al. |
| 2007/0132453 A1 | 6/2007 | Ogino |
| 2007/0149678 A1 | 6/2007 | Apoorva et al. |
| 2007/0189073 A1 | 8/2007 | Aritome |
| 2007/0208905 A1 * | 9/2007 | Litsyn et al. .................. 711/103 |
| 2008/0019188 A1 | 1/2008 | Li |
| 2008/0042598 A1 | 2/2008 | Ilyes et al. |
| 2008/0123420 A1 | 5/2008 | Brandman et al. |
| 2008/0151617 A1 | 6/2008 | Alrod et al. |
| 2008/0244360 A1 * | 10/2008 | Mokhlesi et al. ............. 714/758 |
| 2009/0319868 A1 | 12/2009 | Sharon et al. |

FOREIGN PATENT DOCUMENTS

| | | |
|---|---|---|
| WO | WO 2008/019348 | 2/2008 |
| WO | WO 2008/042593 A1 | 4/2008 |

* cited by examiner

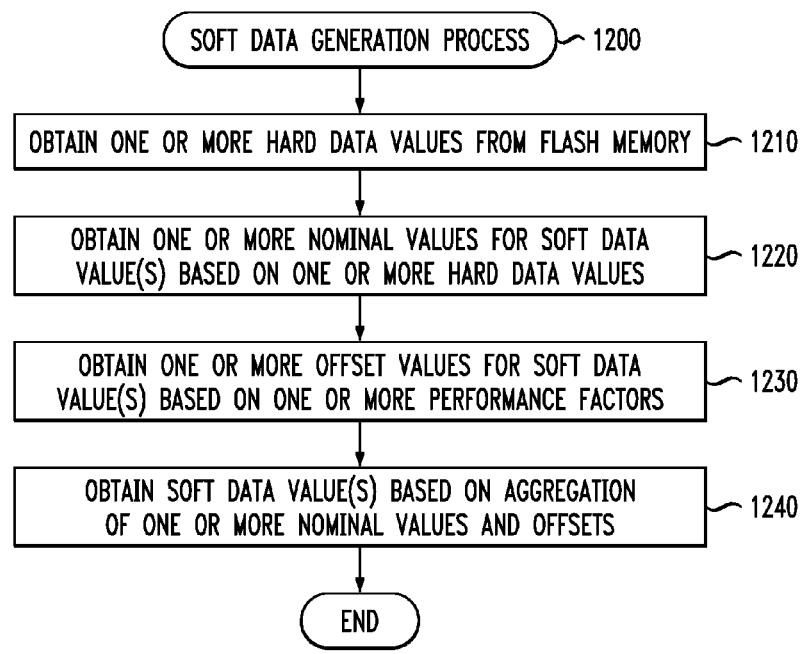

METHODS AND APPARATUS FOR SOFT DATA GENERATION FOR MEMORY DEVICES BASED ON PERFORMANCE FACTOR ADJUSTMENT

The present application is a national stage application filed under 35 U.S.C. §371 of International Patent Application Serial No. PCT/US09/59069, filed Sep. 30, 2009 and claims priority to U.S. Provisional Patent Application Ser. No. 61/194,751, filed Sep. 30, 2008, and International Patent Application Serial No. PCT/US09/49333, filed Jun. 30, 2009, entitled "Methods and Apparatus for Soft Demapping and Intercell Interference Mitigation in Flash Memories," each incorporated by reference herein.

Cross-Reference to Related Applications

The present application is related to International Patent Application Serial No. PCT/US09/59077, entitled "Methods and Apparatus for Soft Data Generation for Memory Devices," International Patent Application Serial No. PCT/US09/59081, entitled "Methods and Apparatus for Soft Data Generation for Memory Devices Using Reference Cells," and International Patent Application Serial No. PCT/US09/59087, entitled "Methods and Apparatus for Soft Data Generation for Memory Devices Using Decoder Performance Feedback," each filed Sep. 30, 2009, each incorporated by reference herein.

FIELD OF THE INVENTION

The present invention relates generally to flash memory devices and more particularly, to improved techniques for soft data generation based on a performance factor adjustment that improves the detection and decoding performance.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). For a more detailed discussion of MLC flash memory devices, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding," incorporated by reference herein.

The analog values stored in memory cells are often distorted. The distortions are typically due to, for example, back pattern dependency (BPD), noise and intercell interference (ICI). For a more detailed discussion of distortion in flash memory devices, see, for example, J.D. Lee et al., "Effects of Floating-Gate Interference on NAND Flash Memory Cell Operation," IEEE Electron Device Letters, pp. 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, pp. 919-928, (April 2008), each incorporated by reference herein.

A number of techniques have been proposed or suggested for mitigating the effect of ICI and other disturbances. For example, Ki-Tae Park, et al. describe existing programming techniques, such as even/odd programming, bottom up programming and multi-stage programming that mitigate ICI. In addition, International Patent Application Serial No. PCT/US09/49333, filed Jun. 30, 2009, entitled "Methods and Apparatus for Soft Demapping and Intercell Interference Mitigation in Flash Memories," discloses methods and apparatus for soft demapping and disturbance mitigation in flash memories.

While these existing methods have helped to improve the decoding performance of flash memories, they suffer from a number of limitations, which if overcome, could further improve the reliability of flash memories. For example, current flash memories typically only provide hard data to the flash control system for decoding. It is well known, however, that soft data can improve error rate performance in the decoding process. Thus, a need exists for soft data generation techniques that use hard data from the flash memory to estimate or enhance the soft data and thereby improve the decoding performance.

SUMMARY OF THE INVENTION

Generally, methods and apparatus are provided for soft data generation for memory devices based on a performance factor adjustment. According to one aspect of the invention, at least one soft data value for a memory device is generated by obtaining at least one read value; and generating the at least one soft data value based on the obtained at least one read value and an adjustment based on one or more performance factors of the memory device. The read value may be soft data and/or hard data and may comprise data bits, voltage levels, current levels or resistance levels (or a combination thereof). The generated soft data value may comprise, for example, (i) a soft read value that is used to generate one or more log likelihood ratios, or (ii) one or more log likelihood ratios.

In one exemplary embodiment, the adjustment adjusts a nominal value based on the obtained at least one read value and the adjustment comprises an offset value based on one or more performance factors of the memory device.

The performance factors may comprise, for example, one or more of endurance, number of program/erase cycles, number of read cycles, retention time, temperature, temperature changes, process corner, inter-cell interference impact, location within the memory array, location of wordline from which the read values is obtained, location of page from which the read values is obtained, location of page within wordline from which the read value is read, and a pattern of aggressor cells. One or more of the performance factors can be varied for one or more different bits within a cell, different pages within a wordline, different bit lines, or different hard read data values.

A more complete understanding of the present invention, as well as further features and advantages of the present invention, will be obtained by reference to the following detailed description and drawings.

BRIEF DESCRIPTION OF THE DRAWINGS

FIG. 12 is a flow chart describing an exemplary alternative implementation of a soft data generation process incorporating features of the present invention; and FIG. 13 is a sample table from an exemplary hard data-to-soft data mapping database incorporating features of the present invention.

DETAILED DESCRIPTION

Various aspects of the present invention are directed to soft data generation techniques for improved decoding in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for memory devices, such as the use of voltages, currents or resistances to represent stored data, as would be apparent to a person of ordinary skill in the art.

Figure 1:
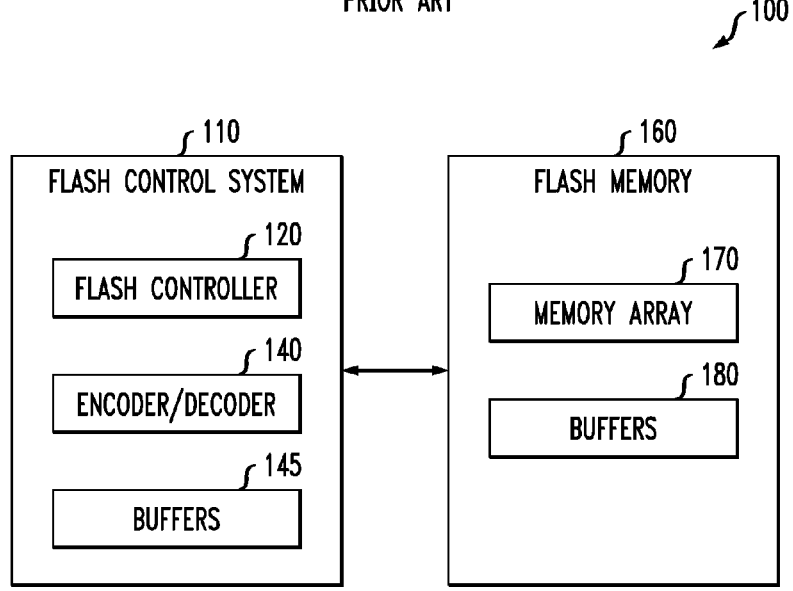
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145.

In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), a Magnetoresistive Random access Memory (MRAM) memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
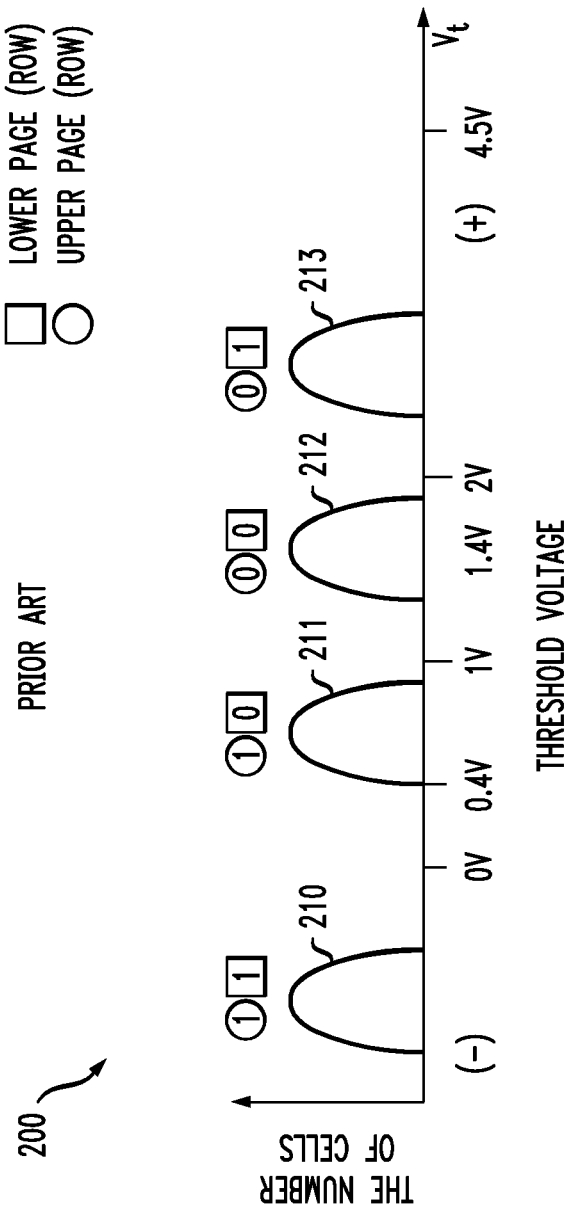
FIG. 2 illustrates an exemplary threshold voltage distribution for the exemplary flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks, with each peak corresponding to one state 210-213. In a multi-level cell flash device, the different states 210-213 of the threshold voltage distribution graph 200 are used for storing two bits in the cell.

The states 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise, when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

The threshold voltage distribution for state 210 represents a distribution of the threshold voltages V1 of the cells within the array that are in an erased state ("11" data state), with negative threshold voltage levels below 0 volts. The threshold voltage distributions for states 211 and 212 of memory cells storing "10" and "00" user data, respectively, are shown to be between 0 and 1 volts and between 1 and 2 volts, respectively. The threshold voltage distribution for state 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
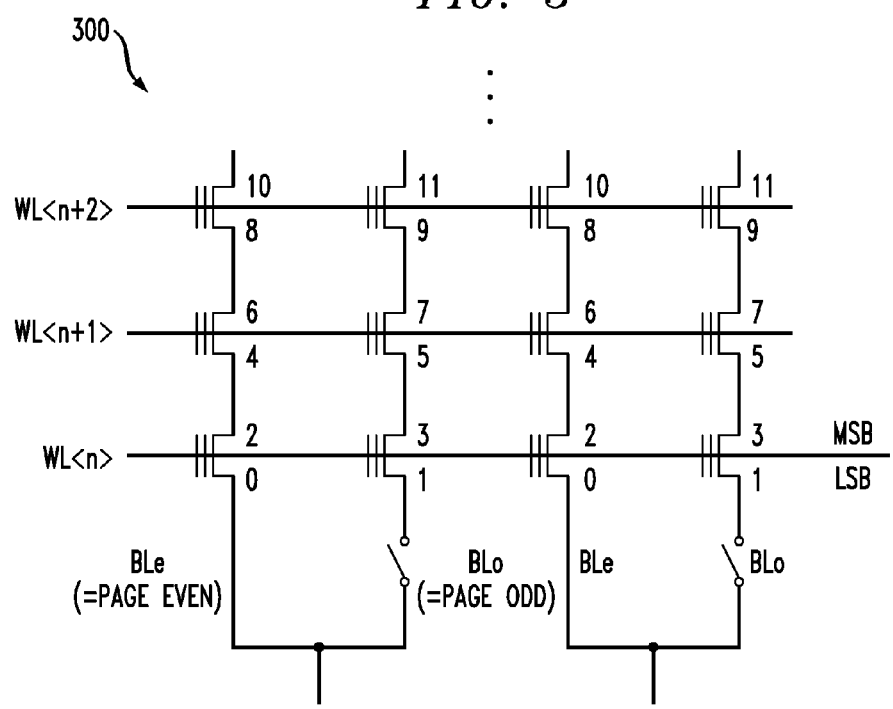
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, pp. 919-928 (April 2008), incorporated by reference herein.

Figure 4:
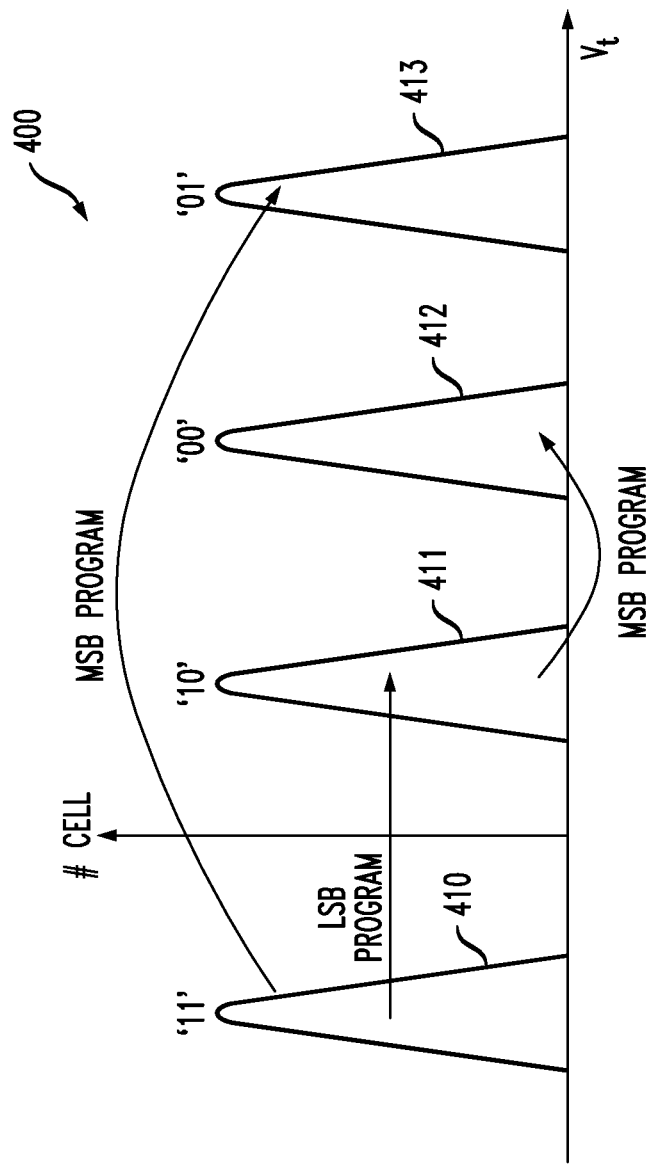
FIG. 4 illustrates an exemplary two-stage MLC programming scheme for the threshold voltage distribution of FIG. 2.

FIG. 4 illustrates an exemplary two-stage MLC programming scheme 400 for the threshold voltage distribution of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states, state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum to voltage shift associated with the change in state from state 410 to state 413. A number of programming schemes have been proposed or suggested to reduce the maximum voltage shift associated with a change in state, and thereby reduce the ICI caused by voltage shifts.

Figure 5A:
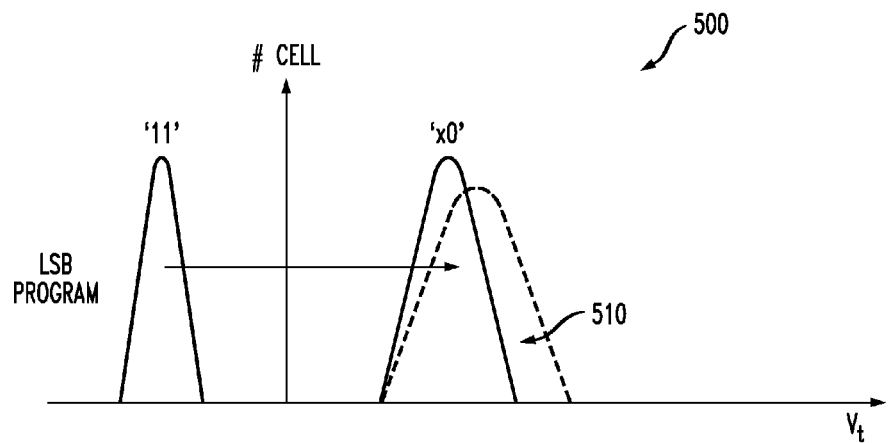
FIGS. 5A and 5B, collectively, illustrate an alternative MLC programming scheme that reduces the ICI inflicted on neighboring cells.
Figure 5B:
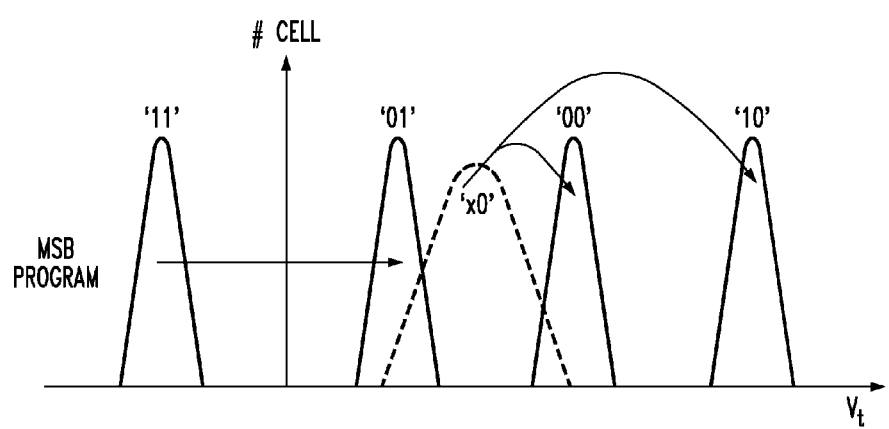

FIGS. 5A and 5B, collectively, illustrate an alternative MLC programming scheme 500 that reduces the ICI inflicted on neighboring cells. As shown in FIG. 5A, during the LSB programming stage, a memory cell is programmed from a state '11' to a state 'x0' as a temporary (or intermediate) state, in a similar manner to SLC programming. After the neighbor cells in the same wordline are also LSB programmed, the distribution is possibly widened as shown by peak or state 510 in FIG. 5A, due to ICI. Thereafter, at the MSB programming stage, shown in FIG. 5B, the 'x0' state is programmed to either '00' or '10' as the final state corresponding to the input data or else the '11' state is programmed to the final '01' state.

Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can been seen in FIG. 5B that the maximum voltage shifts for example during the MSB programming stage are associated with transitions from state '11' to '01' and state 'x0' to state '10' respectively. These voltage shifts are significantly smaller than the maximum voltage shift from state '11' to '01' in FIG. 4.

Figure 6:
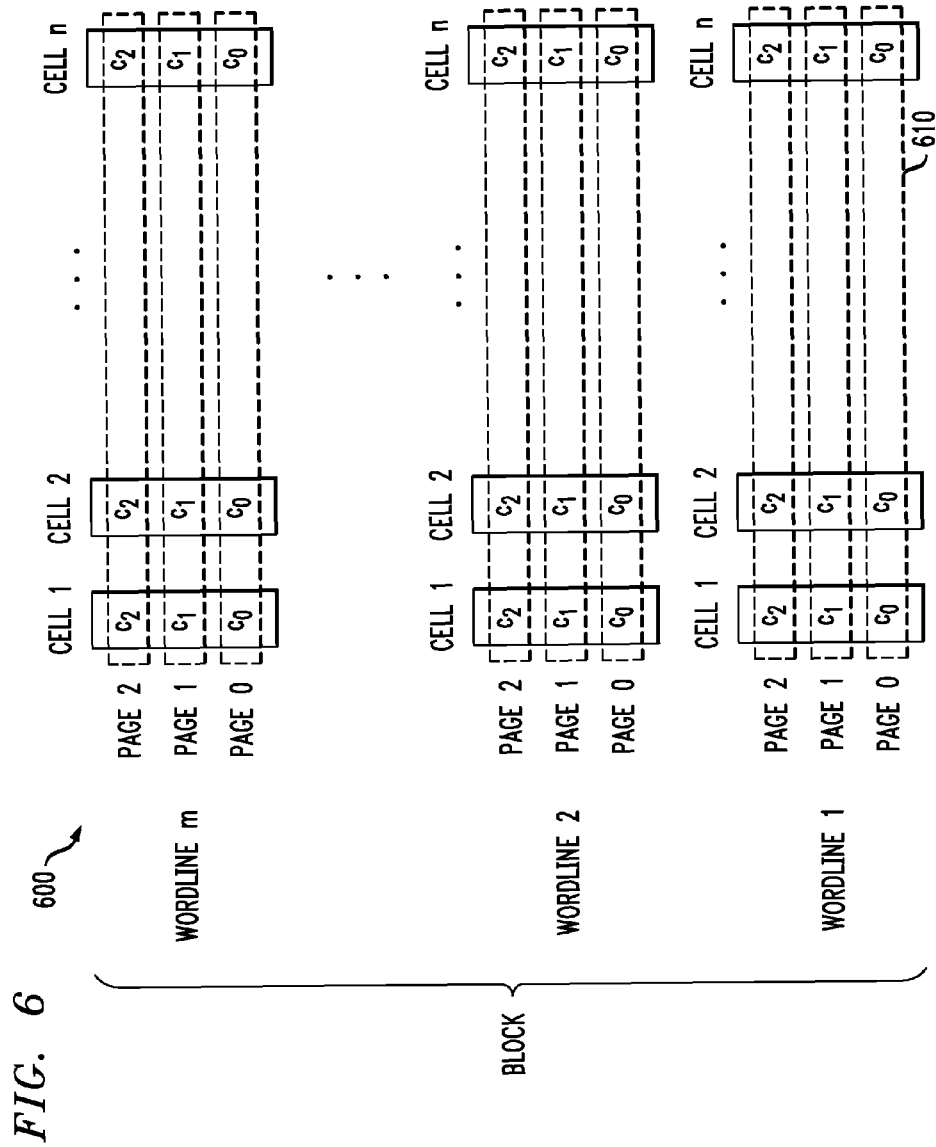
FIG. 6 illustrates an exemplary flash cell array in a multi-level cell (MLC) flash memory device in further detail.

FIG. 6 illustrates an exemplary flash cell array 600 in a multi-level cell (MLC) flash memory device 160 in further detail. As shown in FIG. 6, the flash cell array 600 stores three bits per flash cell, $c_i$. FIG. 6 illustrates the flash cell array architecture for one block, where each exemplary cell typically corresponds to a floating-gate transistor that stores three bits. The exemplary cell array 600 consists of in wordlines and n bitlines. Typically, in current multi-page cell flash memories the bits within a single cell belong to different pages. In the example of FIG. 6, the three bits for each cell correspond to three different pages, and to each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference and Other Disturbances

Figure 7:
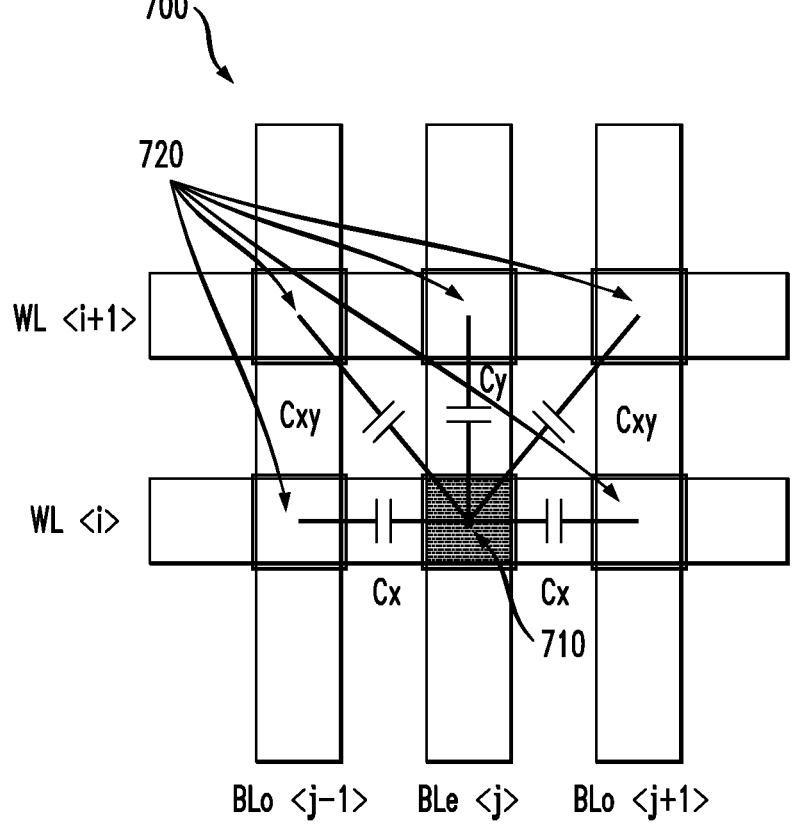
FIG. 7 illustrates disturbances that are present for a target cell due to a number of exemplary aggressor cells, such as intercell interference, back pattern dependency, noise and other distortions.

FIG. 7 illustrates the disturbances that are present for a plurality of cells 700 in an array comprising a target cell 710 due to a number of exemplary aggressor cells 720, such as intercell interference, back pattern dependency, noise and other distortions. The following notations are employed in FIG. 7:

WL: wordline;
BL: bitline;
BLo: odd bitline;
BLe: even bitline; and
C: capacitance.

ICI, for example, is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

For a more detailed discussion of ICI mitigation techniques, see, for example, International Patent Application Serial No. PCT/US09/49326, entitled "Methods and Apparatus for Read-Side Intercell Interference Mitigation in Flash Memories;" or International Patent Application Serial No. PCT/US09/49327, entitled "Methods and Apparatus for Write-Side Intercell Interference Mitigation in Flash Memories," each incorporated by reference herein.

Figure 8:
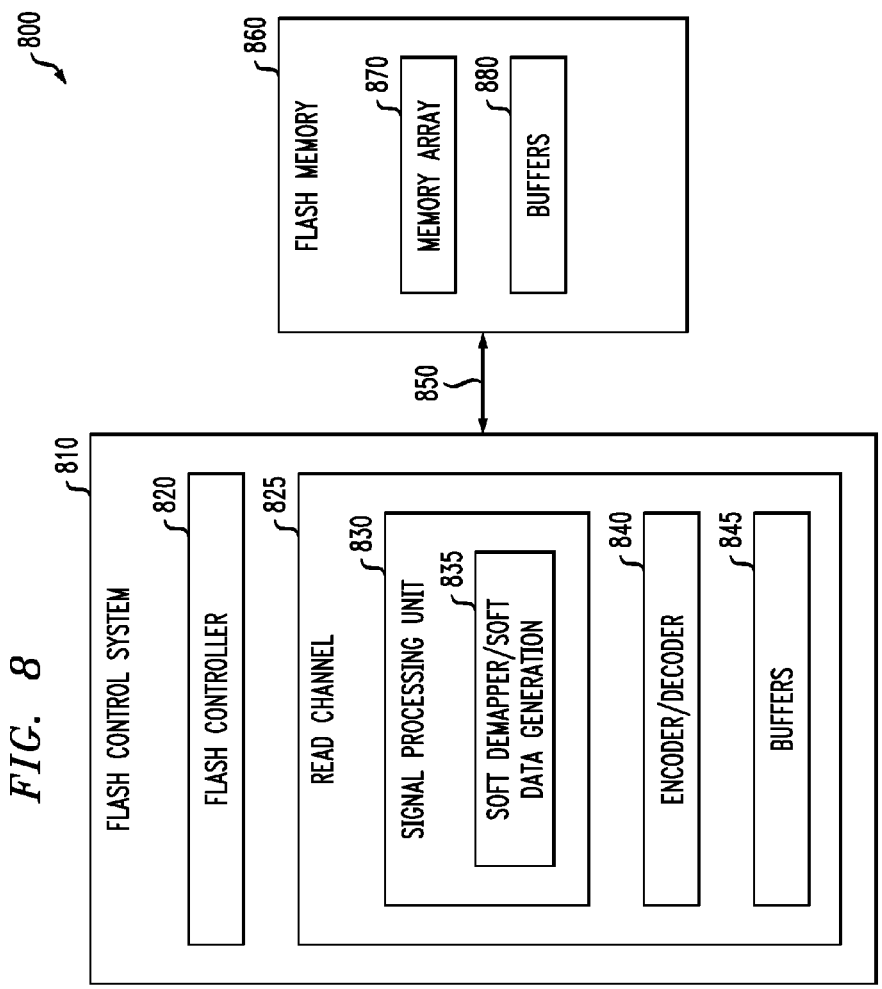
FIG. 8 is a schematic block diagram of an exemplary flash memory system incorporating controller-based soft data generation techniques in accordance with the present invention.

FIG. 8 is a schematic block diagram of an exemplary flash memory system 800 incorporating controller-based soft data generation techniques in accordance with the present invention. As shown in FIG. 8, the exemplary flash memory system 800 comprises a flash control system 810 and a flash memory block 860, connected by an interface 850. The exemplary flash control system 810 comprises a flash controller 820 and a read channel 825, typically on one or more integrated circuits.

The exemplary read channel 825 comprises a signal processing unit 830, an encoder/decoder block 840 and one or more buffers 845. It is noted that the term "read channel" can encompass the write channel as well. In an alternative embodiment, the encoder/decoder block 840 and some buffers 845 may be implemented inside the flash controller 820. The encoder/decoder block 840 and buffers 845 may be implemented, for example, using well-known commercially available techniques and/or products, as modified herein to provide the features and functions of the present invention.

The exemplary signal processing unit 830 comprises one or more processors that implement one or more soft demapper and/or soft data generation processes 835, discussed further below in conjunction with, for example, FIGS. 12A and 12B, respectively. The exemplary flash memory block 860 comprises a memory array 870 and one or more buffers 880 that may each be implemented using well-known commercially available techniques and/or products.

In various embodiments of the disclosed soft data generation techniques, the exemplary interface 850 may need to convey additional information relative to a conventional flash memory system, such as values representing information associated with aggressor cells. Thus, the interface 850 may need to have a higher capacity or faster rate than an interface in conventional flash memory systems. The interface 850 may optionally be implemented, for example, in accordance with the teachings of International PCT Patent Application Serial No. PCT/US09/49328, entitled "Methods and Apparatus for Interfacing Between a Flash Memory Controller and a Flash Memory Array", filed Jun. 30, 2009 and incorporated by reference herein, which increases the information-carrying capacity of the interface 850 using, for example, Double Data Rate (DDR) techniques. During a write operation, the interface 850 transfers the program values to be stored in the target cells, typically using page or wordline level access techniques. For a more detailed discussion of exemplary page or wordline level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 850 transfers hard and/or soft read values that have been obtained from the memory array 870 for target and aggressor cells. For example, in addition to read values for the page with the target cell, read values for one or more adjacent pages in upper/lower wordlines or neighboring even or odd bit lines are transferred over the interface bus. In the embodiment of FIG. 8, the disclosed soft data generation techniques are implemented outside the flash memory, typically in a process technology optimized for logic circuits to achieve the lowest area. It is at the expense, however, of the additional aggressor cell data that may be transferred on the interface 850.

Figure 9:
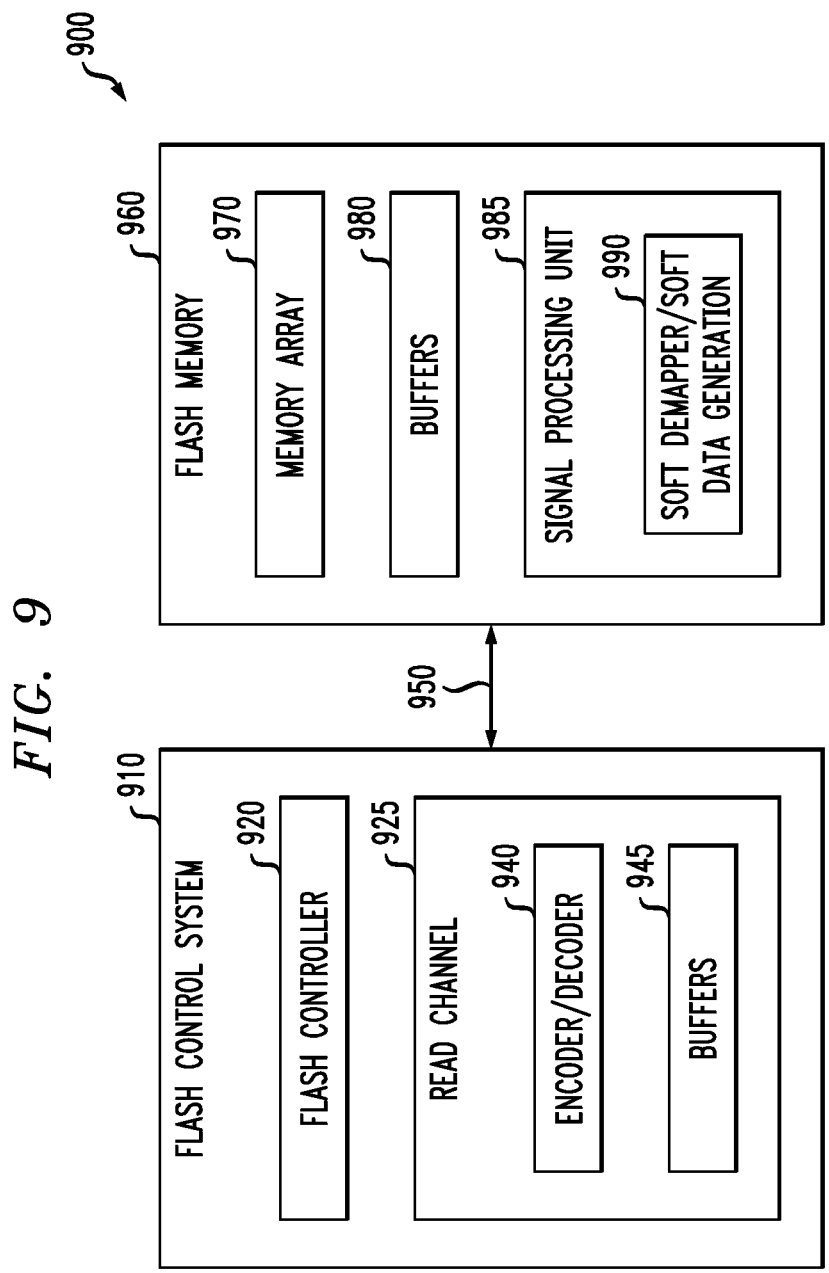
FIG. 9 is a schematic block diagram of an exemplary flash memory system incorporating memory-based soft data generation techniques in accordance with an alternate embodiment of the present invention.

FIG. 9 is a schematic block diagram of an exemplary flash memory system 900 incorporating memory-based soft data generation techniques in accordance with an alternate embodiment of the present invention. As shown in FIG. 9, the exemplary flash memory system 900 comprises a flash control system 910 and a flash memory block 960, connected by an interface 950.

The exemplary flash control system 910 comprises a flash controller 920 and to an optional read channel 925, typically on one or more integrated circuits. In an alternative embodiment, the encoder/decoder block 940 and some buffers 945 may be implemented inside the flash controller 920. The exemplary flash controller 920 may be implemented, for example, using well-known commercially available techniques and/or products, as modified herein to support the features and functions of the present invention. The exemplary read channel 925 comprises an encoder/decoder block 940 and one or more buffers 945. The encoder/decoder block 940 and buffer(s) 945 may be implemented using well-known commercially available techniques and/or products.

The exemplary flash memory block 960 comprises a memory array 970 and one or more buffers 980 that may each be implemented using well-known commercially available techniques and/or products. In addition, the exemplary flash memory block 960 comprises an exemplary signal processing unit 985 that comprises one or more processors that implement one or more soft demapping and/or soft data generation processes 990, discussed further below in conjunction with, for example, FIGS. 12A and 12B, respectively.

In various embodiments of the disclosed soft data generation techniques, the exemplary interface 950 may need to convey additional information relative to a conventional flash memory system, such as values representing information associated with aggressor cells. Thus, the interface 950 may need to have a higher capacity or faster rate than an interface in conventional flash memory systems. The interface 950 may optionally be implemented, for example, in accordance with the teachings of International PCT Patent Application Serial No. PCT/US09/49328, entitled "Methods and Apparatus for Interfacing Between a Flash Memory Controller and a Flash Memory Array", filed Jun. 30, 2009 and incorporated by reference herein, which increases the information-carrying capacity of the interface 950 using, for example, Double Data Rate (DDR) techniques.

During a write operation, the interface 950 transfers the program data to be stored in the target and aggressor cells. During a read operation, the interface 950 transfers the new hard or soft read values or data for the target cell(s) and optionally the aggressor cells. Typically, the information conveyed for a single read access is a page or wordline of data. It is noted that only sending data for the target cells reduces the bandwidth requirements of the interface 950, at the expense of implementing the soft data generation processes inside the memory using the memory process technology used to manufacture the flash memory, which is typically optimized for memory and not logic circuits.

Soft Data Generation Based on Performance Adjustment

As previously indicated, current flash memories 860, 960 typically only provide hard data to the flash control system 810, 910 for decoding. It is well known, however, that soft data can improve error rate performance in the decoding process. Thus, the present invention provides soft data generation techniques that use hard data from the flash memory 860, 960 to estimate or enhance the soft data and thereby improve the decoding performance.

According to one aspect of the present invention, soft data is generated for a memory device, such as a flash memory device 860, 960, based on the hard data and an adjustment based on one or more performance factors. As used herein, soft data comprises soft values where a larger number of bits is used to represent the measured voltage than the number of bits stored in a memory cell of the flash memory device 860, 960, or log-likelihood ratios that indicate the reliability of the bits stored in a memory cell. Hard data refers to the detected data bits (without soft information) or levels (such as voltage levels) stored in a memory cell, which are read out from the flash memory 870, 970 and provided to the flash control system in conventional flash memory devices.

In one exemplary embodiment, the soft data value is the sum of a nominal value that is based on the hard data value assigned by the flash memory block 810, 910 and an offset value (or delta value) that compensates for one or more factors that affect the performance of the flash memory block 810, 910. This soft data value is either a soft read value (such as soft voltage value), which is then used to compute a log-likelihood ratio, or a log-likelihood ratio that indicates the reliability of a stored bit. For a more detailed discussion of the generation and use of log-likelihood ratios, see, for example, International Patent Application Serial No. PCT/US09/49333, filed Jun. 30, 2009, entitled "Methods and Apparatus for Soft Demapping and Intercell Interference Mitigation in Flash Memories," and International Patent Application, filed contemporaneously herewith, entitled "Methods and Apparatus for Soft Data Generation in Flash Memories," each incorporated by reference herein. The log-likelihood ratio generated by the soft data generator 835, 990 is provided to a decoder, such as a Low Density Parity Check (LDPC) decoder.

Figure 10:
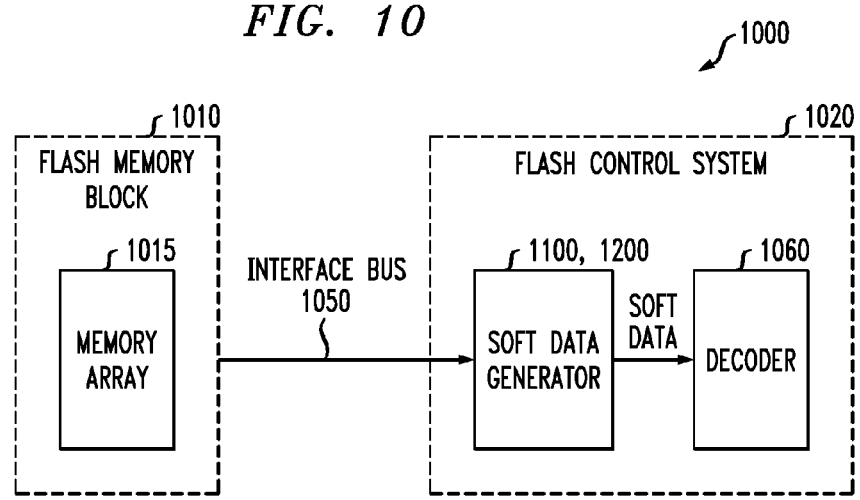
FIG. 10 illustrates an exemplary flash memory system with soft data generation in accordance with the present invention.

FIG. 10 is a schematic block diagram of an exemplary flash memory system 1000. FIG. 10 illustrates the soft data generating techniques of the present invention in further detail. As shown in FIG. 10, the flash memory system 1000 comprises a flash memory block 1010 and a flash control system 1020, connected by an interface bus 1050.

The flash memory block 1010 comprises a memory array 1015. The flash memory block 1010 reads the memory array 1015 and determines the hard data values (i.e., hard data bits or hard levels, such as hard voltage levels) stored in each cell that is read. As discussed hereinafter, hard data values are typically assigned by the flash memory block 1010 and are transferred over the interface 1050 to the flash controller 1020 for further decoding and processing.

The exemplary flash controller 1020 comprises a soft data generator 1100, 1200, discussed further below in conjunction with FIGS. 11 and 12, and a decoder 1060. Generally, the soft data generator 1100, 1200 generates soft data using the hard data values assigned by the flash memory block 1020 and one or more performance factor adjustments. The decoder 1060 may be embodied, for example, using an LDPC Algorithm, such as a Belief Propagation, Message Passing, Sum-Product or Min-Sum algorithm. It is noted that the functions of the soft data generator 1100, 1200 described herein can be implemented in one or more of the flash controller 820, read channel 825, signal processing unit 830 and decoder 840 (see FIG. 8, for example).

As previously indicated, one aspect of the invention computes the soft data as a function of the hard data and additional performance factors. In one exemplary embodiment, the soft data value is the sum of a nominal value that is based on the hard data level assigned by the flash memory block 1010 and an offset value (or a delta value) that compensates for one or more performance factors that affect the performance of the flash memory block 1010.

In one exemplary embodiment, the performance factors that affect the performance of the flash memory block 1010 comprise one or more of endurance (e.g., number of program/erase cycles), number of read cycles, retention time, temperature or temperature changes of the flash memory, process corner used to manufacture the flash memory, inter-cell interference impact or impact due to other disturbance mechanisms, location within the memory array (such as the page level in a wordline, even or odd bitlines, etc.) and data patterns stored in aggressor cells. As discussed further below in conjunction with FIG. 13, in one exemplary embodiment, an offset value can be assigned for each performance factor for each program level. The performance factors can be measured in advance, for example during manufacturing tests, or on an intermittent or periodic basis, to obtain the offset value that compensates for the performance degradation. These performance factors can be programmed or stored in registers of the flash control system 810, 910 or flash memory 860, 960.

For example, the soft data value can be computed as follows:

$$\text{Soft Data Value} = \begin{cases} \text{nominal } value_0 - \text{offset}, & \text{if the hard data value is a 0} \\ \text{nominal } value_1 + \text{offset}, & \text{if the hard data value is a 1} \end{cases}$$

where soft data value indicates, for example, a log-likelihood ratio and where the sign of the soft data value represents the hard data value and the magnitude of the soft data value represents the reliability, nominal $value_0$ is a positive number indicating the maximum possible reliability for bit 0, nominal $value_1$ is a negative number indicating the maximum possible reliability for bit 1, offset is the aggregate offset value that compensates for the considered performance factors that affect the performance of the flash memory block 1010. For example, nominal $value_0$ equals +2 for a hard data value equal to 0, and nominal $value_1$ equals −2 for a hard data value equal to 1. Based on the considered performance factors, the magnitude of the nominal values is reduced when the offset is larger than 0. In other words, the reliability associated with the soft data value is reduced based on performance factors that reduce the reliability of the hard data values.

Typically, the magnitude of the soft data value indicates the reliability of the corresponding hard data value, and the sign of the soft data value indicates whether the corresponding hard data value is a binary 0 or 1. In the exemplary implementation, soft data values can vary between −2 and +2, with 2 corresponding to a value of binary 0 with maximum reliability and with −2 corresponding to a value of binary 1 with maximum reliability. The offset value employed in the above equation characterizes the disturbances that will impact the reliability of the flash memory device. Generally, the offset value varies proportionally with the anticipated disturbance (e.g., the larger the disturbance, the larger the offset value).

In one exemplary embodiment, the offset can optionally be saturated to a predefined value. For example, the offset can be saturated to ensure that the offset does not change the sign of the soft data value, which corresponds to the bit that was assigned by the flash memory device.

Figure 11:
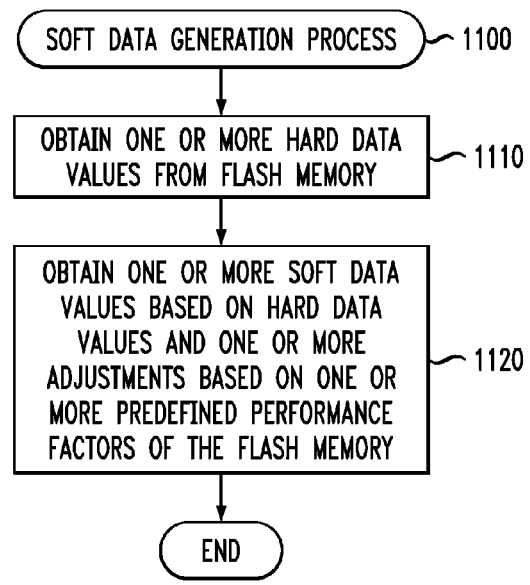
FIG. 11 is a flow chart describing an exemplary soft data generation process incorporating features of the present invention.

FIG. 11 is a flow chart describing an exemplary soft data generation process 1100 incorporating features of the present invention. Generally, the soft data generation process 1100 generates the soft data value by mapping the hard data values to soft data values directly, e.g., using the hard-to-soft data mapping database 1300 (shown in FIG. 13) that addresses the various considered performance factors.

As shown in FIG. 11, the soft data generation process 1100 initially obtains one or more hard data values from flash memory 1010 during step 1110. Thereafter, the soft data generation process 1100 obtains one or more soft data values based on the one or more hard data values and one or more adjustments based on one or more predefined performance factors of the flash memory 1010 during step 1120. For example, the soft data generation process 1100 can use the hard data to perform a look-up in the hard-to-soft data mapping database 1300 shown in FIG. 13. The soft data value represents either a soft read value (such as soft voltage value), which is then used to compute a log-likelihood ratio later, or a log-likelihood ratio that indicates the reliability of a stored bit.

FIG. 12 is a flow chart describing an exemplary alternative implementation of a soft data generation process 1200 incorporating features of the present invention. Generally, the soft data generation process 1200 generates the soft data value by summing a nominal value that is based on the hard data value assigned by the flash memory block 1010 and an offset value that compensates for one or more performance factors that affect the performance of the flash memory block 1010. The soft data value represents either a soft read value (such as soft voltage value), which is then used to compute a log-likelihood ratio, or a log-likelihood ratio that indicates the reliability of a stored bit.

As shown in FIG. 12, the soft data generation process 1200 initially obtains the one or more hard data values from the flash memory 1010 during step 1210. Thereafter, the soft data generation process 1200 obtains the corresponding one or more nominal values based on the one or more hard data values during step 1220 and obtains the corresponding one or more offset values based on the one or more considered performance factors during step 1230. Finally, the soft data generation process 1200 obtains the one or more desired soft data values based on an aggregation of the obtained one or more nominal values and offset values during step 1240.

FIG. 13 is a sample table from an exemplary hard data-to-soft data mapping database 1300 incorporating features of the present invention for an exemplary two-bit/cell MLC flash memory storing a least significant bit (LSB) and most significant bit (MSB) in a flash memory cell. Since different page levels (such as MSB and LSB pages) in an MLC flash memory are impacted differently by the various performance factors, the error rate performance of a flash memory system can be improved by using separate offsets for different page levels. The exemplary hard data-to-soft data mapping database 1300 records the soft data for the LSB and MSB in records 1330 and 1340, respectively, based on the hard data value (e.g., binary 1 or binary 0) indicated in record 1310, and the number of program/erase cycles indicated in record 1320.

In this exemplary database 1300, separate offsets are used for binary 1 and 0 to improve the error rate performance. Using the same offset for binary 1 and 0, and also for the different page levels such as for the MSB and LSB pages can reduce the complexity of the database at the expense of error rate performance.

The hard data-to-soft data mapping database 1300 could also indicate additional location-specific performance factor offsets, such as offsets for even/odd bit lines and/or different wordline locations within a memory array.

It is noted that the hard data-to-soft data mapping database 1300 assumes the exemplary implementation discussed above, where a value of binary 0 can be mapped to +2 and a value of binary 1 can be mapped to −2. It is noted that the exemplary table 1300 can optionally be implemented as a multi-dimensional table to account for pattern-dependency and/or additional performance factors, such as number of read cycles, process corner and temperature changes.

For a more detailed discussion of pattern-dependent and location-specific performance factors, see, for example, International Patent Application, entitled "Methods and Apparatus for Soft Data Generation in Flash Memories," filed contemporaneously herewith and incorporated by reference herein.

Consider an exemplary implementation for the voltage distribution shown in FIG. 4 that accounts for program/erase cycles and endurance, and employs different offsets for different voltage levels. Also, in this implementation, the performance factor offset is specified for a plurality of different process corners, such as typical-typical (TT), fast-fast (FF) and slow-slow (SS). The following performance factors in this exemplary implementation can be based on, for example, measurements or other manufacturing tests that characterize the offset of the flash memory under the conditions associated with the corresponding performance factor:

(1) Endurance factor: for every 500 erase/program cycles, the offset is 0.125 for level 0 (410) with bit label '11'; 0.375 for level 1 (411) with bit label '10' and level 3 (413) with bit label '01'; 0.25 for level 2 (412) with bit label '00'.

(2) Process Corner factor: the offset is for different process corners the flash memory is manufactured in: SS: 0.25; TT: 0; FF: 0.375.

Thus, for level 1 after 500 erase/program cycles and SS process corner, the soft data will be for the LSB (hard data bit=0): 2−0.375−0.25=1.375. The soft data for the MSB bit (hard data bit=1) will be: −2+0.375+0.25=−1.375. In this exemplary embodiment, the same performance factor offsets are used for both the LSB and MSB in a cell. As explained above, different performance factor offsets can be used for both LSB and MSB to further improve the error rate performance.

According to another aspect of the present invention, enhanced soft data values are generated from the soft data values that are initially assigned by the flash memory device. The initial soft data values are adjusted based on one or more considered performance factors to generate enhanced soft data values. These enhanced soft data values represent either soft read values (such as soft read voltages), which are used to compute log-likelihood ratios or reliabilities, or they represent log-likelihood ratios or reliabilities.

In one exemplary implementation, one or more soft read values are obtained to from the flash memory; and soft information, such as log-likelihood ratios is obtained based on the soft read values. Then the soft information (such as log-likelihood ratios) is adjusted based on one or more performance factors of the flash memory to obtain enhanced soft information, that is enhanced soft data values, which is then passed to a decoder to improve error rate performance.

In another exemplary implementation, one or more soft read values are obtained from the flash memory. Corresponding nominal values are then determined based on the soft read value and corresponding offset values are obtained based on one or more considered performance factors. The desired soft information, that is soft data values, such as log-likelihood ratios, are then obtained based on the nominal values and the offset values.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any storage device able to be read from or written at an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for generating at least one soft data value for a memory device, comprising the steps of:
obtaining at least one read value from said memory device;
obtaining at least one nominal value based on said at least one read value obtained from said memory device, wherein said at least one nominal value indicates a reliability of at least one bit of said at least one read value;
obtaining at least one offset value based on one or more performance factors of said memory device; and
generating said at least one soft data value by applying said at least one offset value to said at least one nominal value.

2. The method of claim 1, wherein said one or more performance factors comprise one or more of endurance, number of program/erase cycles, number of read cycles, retention time, temperature, temperature changes, process corner, inter-cell interference impact, location of a memory cell within the memory device, location of a wordline from which said at least one read value is obtained, location of a page from which said at least one read value is obtained, location of a page within a wordline from which said at least one read value is obtained, and a pattern of aggressor cells.

3. The method of claim 1, wherein said at least one offset is based on separate performance factors for one or more of different bits within a cell, different pages within a wordline, different bit lines, and different hard read data values.

4. The method of claim 1, wherein said at least one read value comprises one or more of data bits, voltage levels, current levels and resistance levels.

5. The method of claim 1, wherein said at least one read value comprises one or more of soft data and hard data.

6. The method of claim 1, wherein said at least one soft data value comprises one or more of (i) a soft read value that is used to generate one or more log likelihood ratios, and (ii) one or more log likelihood ratios.

7. The method of claim 1, wherein said at least one soft data value indicates a reliability of said at least one read value.

8. The method of claim 1, wherein one or more of said steps are implemented by one or more of a controller, a read channel, a signal processing unit and a decoder.

9. The method of claim 1, wherein said offset is obtained in advance and stored in said memory device.

10. The method of claim 1, further comprising the step of measuring said offset.

11. The method of claim 1, wherein said one or more performance factors comprise one or more pattern-dependent performance factors.

12. The method of claim 1, wherein said one or more performance factors comprise one or more location-specific performance factors.

13. The method of claim 1, wherein said memory device is a flash memory device.

14. The method of claim 1, wherein said offset reduces a reliability value of said at least one read value.

15. The method of claim 1, wherein said at least one offset reduces a reliability value of said nominal value by an amount equal to said offset value.

16. A system for generating at least one soft data value for a memory device, comprising:
   a program memory; and
   at least one processor, coupled to the program memory, operative to:
   obtain at least one read value from said memory device;
   obtain at least one nominal value based on said at least one read value obtained from said memory device, wherein said at least one nominal value indicates a reliability of at least one bit of said at least one read value;
   obtain at least one offset value based on one or more performance factors of said memory device; and
   generate said at least one soft data value by applying said at least one offset value to said at least one nominal value.

17. The system of claim 16, wherein said one or more performance factors comprise one or more of endurance, number of program/erase cycles, number of read cycles, retention time, temperature, temperature changes, process corner, inter-cell interference impact, location of a memory cell within the memory device, location of a wordline from which said at least one read value is obtained, location of a page from which said at least one read value is obtained, location of a page within a word line from which said at least one read value is obtained, and a pattern of aggressor cells.

18. The system of claim 16, wherein said at least one soft data value comprises one or more of (i) a soft read value that is used to generate one or more log likelihood ratios and (ii) one or more log likelihood ratios.

19. The system of claim 16, wherein said memory device is a flash memory device.

20. The system of claim 16, wherein said one or more performance factors comprise one or more location-specific performance factors.

* * * * *